United States Patent [19]
Collet et al.

[11] Patent Number: 4,485,315
[45] Date of Patent: Nov. 27, 1984

[54] BLOOMING SUPPRESSION IN A CCD IMAGING DEVICE

[75] Inventors: Marnix G. Collet, Sunnyvale, Calif.; Johannes G. van Santen, Eindhoven, Netherlands

[73] Assignee: U.S. Philips Corporation, New York, N.Y.

[21] Appl. No.: 578,301

[22] Filed: Feb. 9, 1984

Related U.S. Application Data

[63] Continuation of Ser. No. 231,649, Feb. 5, 1981, abandoned.

[30] Foreign Application Priority Data

Feb. 19, 1980 [NL] Netherlands ............ 8000998

[51] Int. Cl.³ ............ H01L 29/78; H01L 27/14; H01L 31/00; G11C 19/28
[52] U.S. Cl. ............ 307/311; 357/24; 357/30; 377/58
[58] Field of Search ............ 357/24 LR, 24 M, 30; 377/58; 307/311

[56] References Cited

U.S. PATENT DOCUMENTS 3,931,465  1/1976  Levine ............ 357/24 LR
4,328,432  5/1982  Yamazaki ............ 357/24 LR

OTHER PUBLICATIONS

Sequin, C. H., "Blooming Suppression in Charge-Coupled Area Imaging Devices", The Bell System Technical Journal, pp. 1923-1926, (Oct. 1972).
Kosonocky, W. F., et al., "Control of Blooming in Charge-Coupled Images", RCA Review, pp. 3-24, (Mar., 1974).

Primary Examiner—Gene M. Munson
Attorney, Agent, or Firm—Marc D. Schechter

[57] ABSTRACT

A CCD solid state image sensor device. During the integration period the surface in the image pick-up section is switched alternately into inversion and into accumulation. Any excess of charge carriers which results from possible overexposure can thus be drained by means of recombination via sufaces states.

10 Claims, 18 Drawing Figures

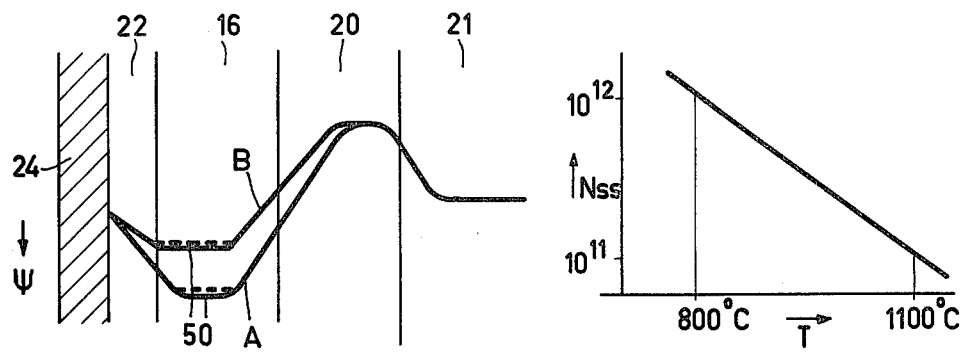
FIG.5d    FIG.6
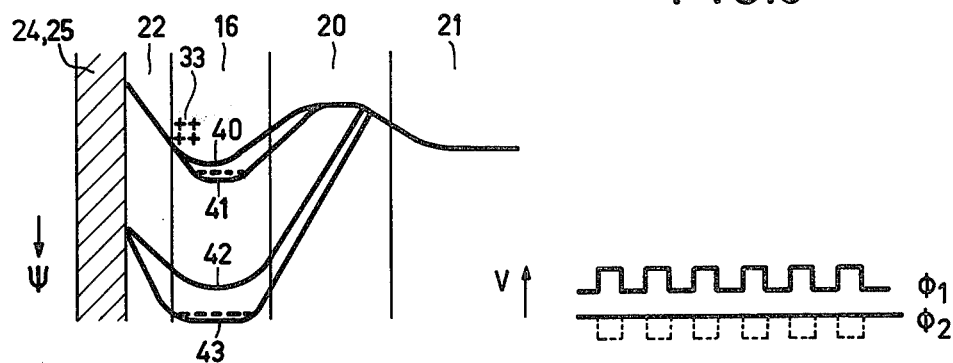
FIG.7    FIG.8
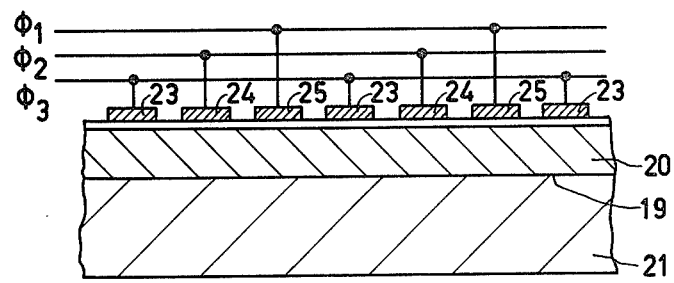
FIG.9
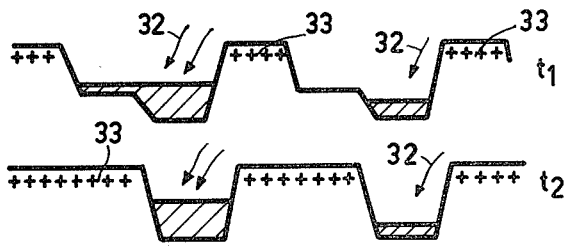
FIG.10a
FIG.10b

BLOOMING SUPPRESSION IN A CCD IMAGING DEVICE

This is a continuation of application Ser. No. 231,649, filed Feb. 5, 1981, now abandoned.

BACKGROUND OF THE INVENTION

The invention relates to a solid state pick-up camera having a photosensitive target. The target comprises a semiconductor body having a surface at which there are a number of charge storage capacities. During operation charge carriers of a first type, which are generated locally in the semiconductor body by absorption of incident radiation, can be stored and integrated in the storage capacities for a certain integration period. The photosensitive target further includes means for preventing excess charge carriers, which are generated during local overexposure, from spreading in the semiconductor body from a full charge storage capacity to adjacent storage capacities.

The photosensitive target may be, for example, of the charge-coupled type which is generally known from published literature. Such a device comprises a series of clock voltage electrodes which are situated one behind the other. During operation clock voltages can be applied to these electrodes so that in the charge transport channel (below the clock voltage electrodes) a train of charge packets can be moved to a read-out member and can be read out there sequentially. The charge packets can be generated in the CCD itself and can be stored by inducing in the CCD for a certain integration period a pattern of potential wells which are separated from each other by barriers and which are accessible to incident radiation. In this manner a radiation pattern can be converted into a pattern of charge packets which have been obtained by integration of the locally generated photocurrents in the potential wells. After termination of the integration period the charge packets can be transported to a read-out member in a charged-coupled manner.

A known problem in this type of target occurs in the case of overexposure, in which such a large excess of charge carriers is formed that charge from a full potential well diffuses to adjacent, not yet full potential wells. This phenomenon, often referred to as "blooming", in charge-coupled devices has the tendency of filling in the first instance the potential wells in the same CCD line. Thus, a pinpoint overexposure in displaying the picked up picture will result in a very annoying white line extending vertically over the picture.

In the article entitled "Blooming Suppression in Charge-Coupled Area Imaging Devices" by C. H. Sequin (published in *The Bell System Technical Journal* of October 1982, pp. 1923-1926), a photosensitive target is described in which drain channels which are separated from the CCD channels via overflow barriers are provided between the CCD registers. Since the overflow barriers are slightly lower than the potential barriers between successive potential wells in the CCD channels, excessive charge carriers, before spreading over a CCD channel, can be removed via the overflow barriers and the drain channels.

This method very effectively prevents "blooming". However, due to the presence of the drain zones and the means to form the overflow barrier, the sensor will become larger and more complex. In addition, the parts of the semiconductor body present between the CCD and occupying a comparatively large part of the photosensitive surface do not contribute to the photosensitivity, so that the advantage of eliminating blooming is offset by a decrease in the resolving power and sensitivity of the device.

In the article entitled "Control of Blooming in Charge-Coupled Imagers" by W. F. Kosonocky et al (*R.C.A. Review*, Vol. 35, March 1974, pp. 3-24), an "anti-blooming" method is described when using a CCD with a surface channel. In this method, the surface regions are brought into an accumulation mode during the integration period at the area of the potential barriers between the potential wells, that is to say they are brought into a state in which an excess of charge carriers of the other type (opposite to the charge carriers of the photocurrent) is present.

This method has the advantage that the sensor is not made larger or more complex. However, the effectiveness of this method will be lower than that of the first method, since a certain amount of blooming will nevertheless occur due to diffusion. Moreover, this method can be used only in CCD sensor with surface channels.

It is to be noted that the phenomenon of "blooming" can also occur in devices other than the ones described here. For example, blooming can also occur in charge-coupled sensors of the interline type or in so-called xy-sensors in which the reading out takes place by selecting the photoelements in the x-direction and the y-direction. Although the invention (to be described below) is of particular importance for the above-described pick-up sensors in which the generation and integration of photocurrents take place in the charge coupled device itself, the discoveries on which the invention is based can in principle be applied also to pick-up cameras having other photosensitive targets in which the phenomenon of blooming may occur.

SUMMARY OF THE INVENTION

It is an object of the invention to provide a solid-state pick-up camera in which blooming is effectively prevented while avoiding the need for an extra large and-/or complex photosensitive target. Another object of the invention is to provide a solid-state camera with which a radiation image with a high resolving power can be converted into electricl signals while avoiding "blooming" phenomena.

The invention is based, inter alia, on the recognition of the fact that charge carriers can be dissipated not only via drain zones and external conductors, but also at the area in the semiconductor body via so-called capture centers or deep energy states.

According to the invention, a solid-state pick-up camera includes charge storage capacities and anti-blooming means. With each charge storage capacity there is a first clock electrode which belongs to the anti-blooming means. The first clock electrode is provided on an insulating layer covering the surface and is connected to a voltage source. The voltage source provides voltages such that during the integration period, the surface region of the semiconductor body present below the clock electrode is alternately brought into inversion and into accumulation. As a result of this, in one state excess charge carriers of one type can be collected in the surface region and can be drained by means of recombination, via surface states present in the surface region, with charge carriers of the other type, which can be captured in the other state. Beside the first clock electrode, the anti-blooming means includes at least a second clock electrode which is connected to a second voltage source. The second voltage source provides voltages such that when the surface region below the first clock electrode is in the one state, charge carriers of the other type can be stored below the second clock electrode. When the surface region below the first electrode is brought in the other state, charge carriers of the other type can be transferred to the surface region. Since the clock electrodes of the CCD line may be used for anti-blooming, no extra means are required between the CCD lines. As a result, the photosensitive surface can be used very effectively. Since the charge carriers of the other type can be moved up and down between the second and the first electrode, anti-blooming can be performed with sufficiently high speed over the whole matrix.

A favorable embodiment in which a sufficiently high overexposure can be tolerated with the usual density of surface states and with the usual line read-out times, is characterized in that the charge storage capacities form part of a system of photosensitive elements which are arranged according to lines and columns. The photosensitive elements can be read-out line by line. The voltage source supplies a voltage to the clock electrode as a result of which the surface region below the clock electrode is brought from one state to the other state at least once per line read-out time.

In further favorable embodiment, inteference signals which result from the commutation between the inversion and accumulation states are avoided by switching the clock electrode from one state to the other state during the line flyback time.

BRIEF DESCRIPTION OF THE DRAWING

FIGS. 5a, 5b, 5c and 5d show potential profiles which are formed in the charge-coupled channel during operation.

FIG. 6 shows the relationship between the concentration of surface states and the oxidation temperature T.

FIG. 7 shows potential profiles in the CCD-channel when the charge-coupled device shown in FIGS. 1 to 3 is operated differently.

FIG. 8 shows clock voltages which are applied to the clock voltage electrodes.

FIG. 9 is a sectional view of an embodiment of a photosensitive target with a surface channel.

FIGS. 10a and 10b show potential profiles in the CCD channel in the device shown in FIG. 9.

DESCRIPTION OF THE PREFERRED EMBODIMENTS

Figure 1:
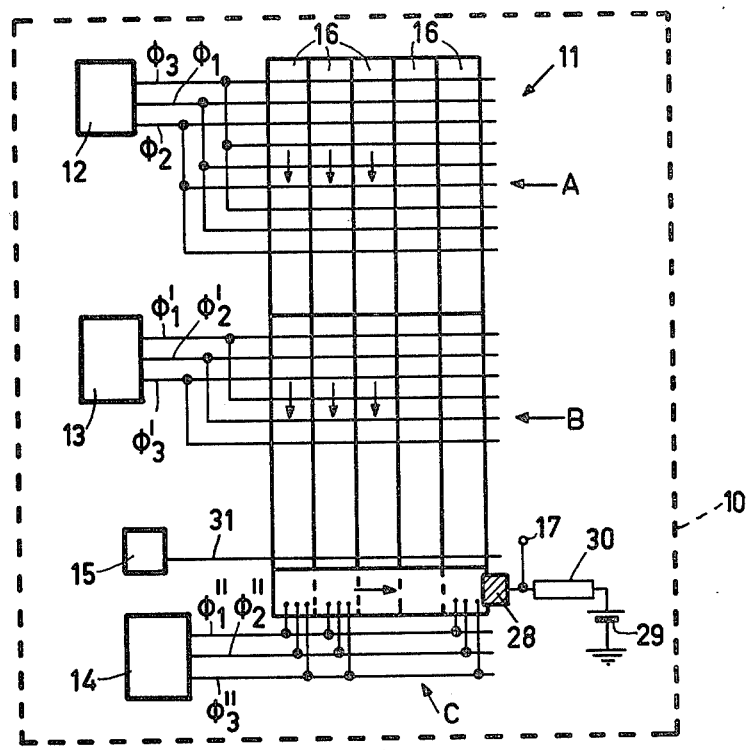
FIG. 1 schematically shows a pick-up camera according to the invention.

FIG. 1 schematically shows a camera according to the invention, denoted by the broken line 10, having within the line 10 the photosensitive target 11 and the associated clock generators 12, 13, 14 and 15. Other components which are usual in solid-state pick-up camera's, for example, for gamma correction, lenses, diaphragms and so on, to which the invention does not relate, are not shown for clarity.

The target 11 is formed by a photosensitive semiconductor device of a type in which a radiation pattern is converted into a pattern of charge packets by integrating generated charge carriers of a given type for a certain integration period in a mosaic of charge storage capacities. In the present embodiment the sensor is of the charge-coupled type and comprises a number of juxtaposed charge-coupled devices 16. In FIG. 1, only five of these charge-coupled lines are shown. Actually, however, the number will be much larger and will be at least 300 for television applications. The clock voltage electrodes are shown diagrammatically in FIG. 1 by the lines $O_1$, $O_2$ and $O_3$.

The sensor is of the known "frame field transfer" type and comprises two sections: image section A and memory section B having a number of vertical CCD-lines, and a horizontal read-out CCD line C. The image to be converted is captured in the A section. The charge pattern which is formed in the A section during the integration period is rapidly moved into the B section after the integration period. The charge pattern can now be moved into the C register line by line. The output signal can be read-out at the output terminal 17. During read-out, a picture can be recorded in the A section.

The sensor 11 further comprises means to prevent excess charge carriers which are generated by local overexposure from diffusing within the A register from a full charge storage capacity to adjacent storage capacities ("blooming"). According to the invention these means comprise a clock electrode 24 which is associated with each charge storage capacity and which is connected to a voltage source 12. Voltage source 12 supplies such voltage that during the integration period, the surface region of the semiconductor body present below the electrodes 12 can alternately be brought, at least in the case of overexposure, into inversion and into accumulation states. In one of these states, depending on the type of charge carriers, excess charge carriers will be collected in the surface region. By recombination, via surface states present at the area, with charge carriers of the other type which are captured in the other state, the excess charge carriers can then be dissipated.

Figure 3:
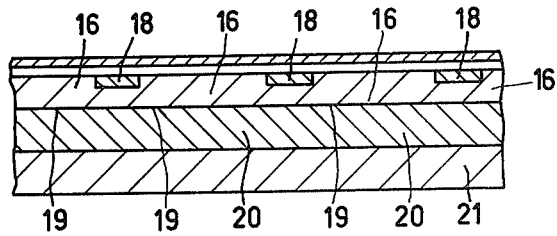
FIG. 3 is another sectional view of the photosensitive target used in the camera shown in FIG. 1.

As shown in FIG. 3, which is a cross-sectional view of a part of the A-section transverse to the charge transport direction, the CCD channels 16 are separated from each other only by channel-bounding regions 18. Drain zones between the CCD channels 16, though they are usual in known anti-blooming methods and though they take up comparatively much space in the semiconductor body, are not necessary in the camera according to the invention, so that a compact sensor with a comparatively large density of photosensitive elements can advantageously be used.

In the present embodiment, the clock electrodes together with underlying parts of the CCD channels constitute the photosensitive elements. However, the photosensitive elements may, of course, also form a matrix of rows and columns in which the CCD channels are arranged between the columns of photosensitive elements. Nor is the invention restricted to CCD sensors. It may also be applied with sensors in which the photosensitive elements are read out, for example, by means of XY selection.

The charge-coupled devices may comprise a surface channel, but in the disclosed case they are of the bulk or buried channel type, in which the charge transport in the form of majority charge carriers (with respect to the conductivity type of the transport channels 16) takes place at a distance from the surface of the semiconductor body. For that purpose, the channel regions 16 are bounded on the lower side by the reverse p-n junction 19 which the channel regions 16 form with the region 20 of the opposite conductivity type. The zone 20 may extend as a substrate over the whole thickness or substantially the whole thickness of the semiconductor body, and may be provided with the channel regions 16 by means of epitaxy or doping. In the present embodiment, however, the semiconductor body comprises a substrate 21 of the same conductivity type as the channel regions 16, while the region 20 only forms a zone between the substrate 21 and the channel regions 16. Application of this three layer structure has the advantage that charge carriers which are generated at a large distance from the upper surface cannot land, as a result of diffusion in the semiconductor body, in charge storage places situated far remote.

In a specific embodiment, the semiconductor body comprises a substrate 21 of an n-type silicon having a thickness of approximately 300 um and a resistivity of 1-30 Ohm.cm. The channel regions 16 which are also of the n-type, for example, have a thickness of approximately 1-3 um and a doping concention of $10^{15}$–$10^{16}$ atoms/cm$^3$. These channel regions are insulated from the substrate 21 by the intermediate p-type layer 20 having a thickness of 2-5 um and a doping concentration of $5\cdot10^{14}$–$4\cdot10^{15}$ atoms/cm$^3$, and are insulated from each other by the p-type regions 18. The p-type regions 18 can advantageously extend over the whole thickness of the channels 16 up to the zone 20. However, the zones 18 preferably extend only over a part of the thickness of channels 16, and they are separated from the zone 20 by an intermediate n-type region. Charge carriers which are generated locally will thus not disappear but can flow to the CCD channels 16 on either side of the p-type zones 18.

The regions 16, 18 and 20 can be provided in a generally known way which need not be further described here. A layer 22 of silicon oxide is grown on the surface of the semiconductor body in a thickness of approximately 700 A. On this layer the clock voltage electrodes 23, 24, 25, 23', 24', 25' and 23" are provided (see, FIG. 2). The electrodes 23, 24, 25 are connected to the clock lines $\phi_1$, $\phi_2$ and $\phi_3$ of the A section and extend across the sensor part A in a direction perpendicular to the direction of charge transport. In a specific embodiment as described in Netherlands patent application Ser. No. 8000999, filed Feb. 19, 1980, and U.S. patent application Ser. No. 235,212, filed Feb. 17, 1981 (PHN 9683), the contents of which are incorporated in this application by reference, for example, the electrodes 24 and 25 may be provided in the direction indicated in the Figure, while the electrodes 23 may extend transverse thereto and parallel to the direction of charge transport, so that light-pervious windows are formed between the electrodes and hence an improved blue sensitivity can be obtained.

The electrodes 23', 24' and 25' are connected to the clock lines $\phi_1'$, $\phi_2'$ and $\phi_3'$ in the B section. Electrode 23" is one of the clock electrodes of the C register which comprises the clock lines $\phi_1''$, $\phi_2''$ and $\phi_3''$ which are shown in FIG. 1 only. If desired, an extra transfer electrode $O_{TG}$ may be provided between the B section and the C register, which electrode controls the transport between the B-section and the C register. According to the diagram of FIG. 1, this electrode is connected to a separate voltage source 15 but it may also be connected to one of the clock lines $\phi_1''$, $\phi_2''$ and $\phi_3''$.

It is to be noted that for simplicity the clock electrodes in the Figures are denoted as juxtaposed conductive layers but it will be obvious that actually multilayer polycrystalline silicon layers are used for the electrodes, so that the electrodes will overlap each other as is usual in CCD technology.

Figure 2:
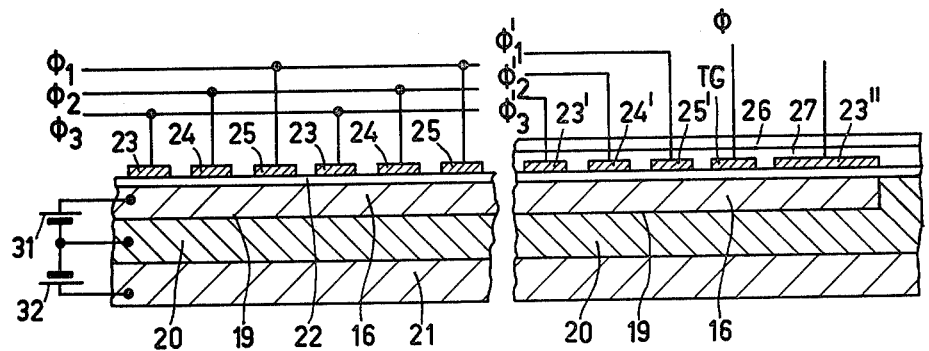
FIG. 2 is a sectional view of the photosensitive target used in the camera shown in FIG. 1.

As is further shown in FIG. 2, a radiation-screening layer 26 is provided above the B section and the C register. This layer may be, for example, of Al and may be isolated from the underlying clock electrodes by the oxide layer 27. If desired, the screening layer 26 which stops the incident radiation so that no or at least substantially no radiation can be absorbed in the underlying part of the semiconductor body, may form part of the clock electrodes.

The output register C (FIG. 1) further comprises an output stage having an n+ contact zone 28 which is connected via a series voltage source 29 and via the resister 30 to ground and to the output terminal 17.

Of course, other known output stages may alternatively be used, for example, source follower circuits.

During operation, a bias voltage of, for example, +5 V is applied via the output zone 28 to the channel regions 16, and a negative bias of −5 V is applied to the p-type zone 20. The channels 16 may then be fully depleted so that, as is generally known, the device is ready for charge transport in the bulk, or buried channel mode. In FIG. 2, the bias voltage is shown diagrammatically by the voltage source 31. A positive voltage 32 may also be applied to the n-type substrate 21 with respect to the p-type layer 20. The value of the voltage 32 which mainly serves to drain charge carriers which are generated in the region 21 is, for example +5 V.

Figure 4A:
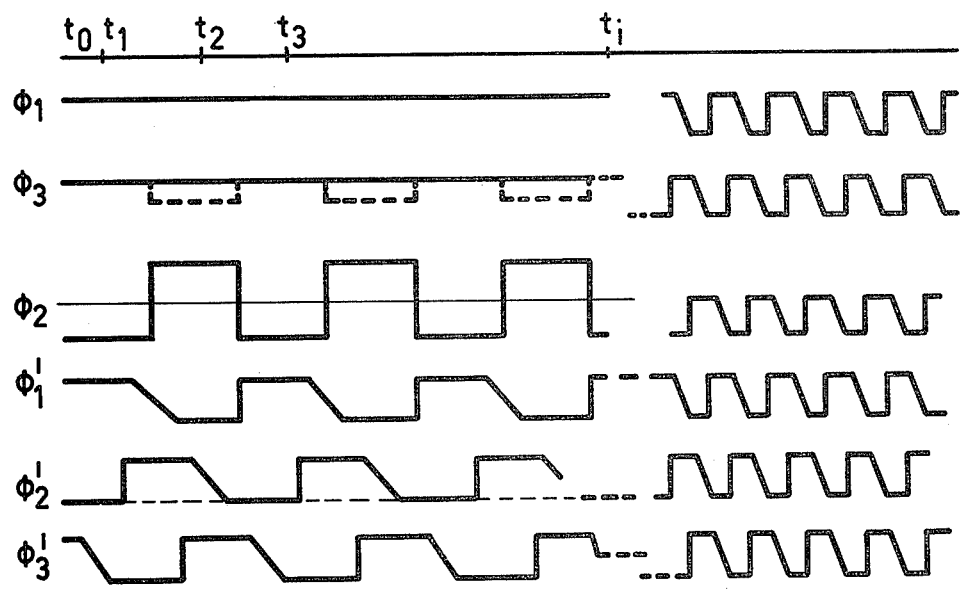
FIGS. 4a and 4b show the clock voltages, which are applied during operation of the camera, as a function of time.
Figure 4B:
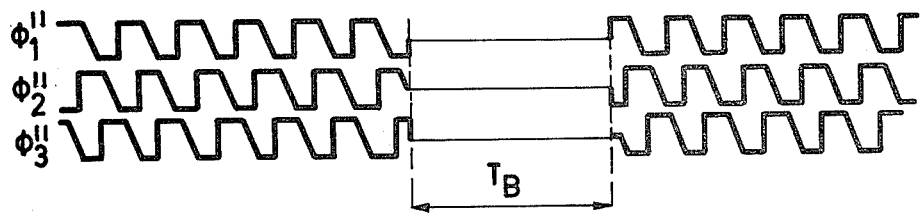

FIG. 4a shows the clock voltages which during operation are applied to the clock electrodes of the image section A and the memory section B. FIG. 4b shows the clock voltages which are applied to the serial register C and to the transfer gate TG. During the integration period from $t_0$ to $t_1$, a radiatioin pattern which is incident on the picture section A is converted into a pattern of charge packets. The integration gates (i.e. the system of clock electrodes below which the generated charge is integrated) may be, of example, the clock electrodes connected to $\phi_1$. A fixed voltage of, for example, 1V is applied to these electrodes.

Simultaneously, a pattern of charge packets which corresponds to a previous radiation pattern, may be stored in the memory section. This charge pattern can be introduced line by line into the C register, for example, via the transfer gage TG. The charge packets of this line may be transported in a horizontal direction to the output 28 and may be read there sequentially. In the meantime, the charge pattern stored in the B section may be moved one line, and a subsequent line may be moved below the transfer gate TG. This line can be moved into the C register when the charge packets of the preceding line have been read out during the line suppression time, denoted in FIG. 4b by $T_B$. (With a length of N bits in the C register, the frequencies of the clock voltages $\phi_1''$, $\phi_2''$, $\phi_3''$ which are used to transport charge in the C register will be N times as high as the frequency of the clock voltages of the B section.) In a sensor of approximately 300 columns, N will be approximately 300, which means that the transport in the C register should take place approximately 300 times faster than in the B section. For simplicity, clock voltages $\phi_1''$, $\phi_2''$, $\phi_3''$ are shown in FIG. 4 with a frequency which is only a few times higher than that of the clock voltages $\phi_1''$, $\phi_2''$, $\phi_3''$. However, it will be obvious that this difference should actually be deemed to be much larger.

In the same time that the charge pattern stored in the memory section B is read out line by line, a new charge pattern is generated in the image section A. For this purpose, the electrodes 25 which are connected to $\phi_1$ are set up at a fixed positive potential, for example 1V. The clock voltage electrodes 23 are, for example, at $-4$ V. The electrodes 24, which in usual cameras with image sensors of the above-described type are kept at a fixed potential, vary in the present camera according to the invention between two levels, for example, between $-4$ V and $+6$ V.

Figure 5A:
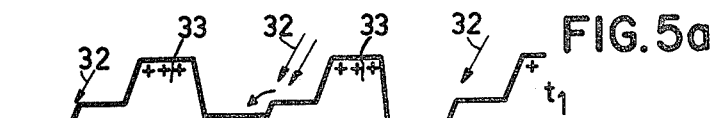
Figure 5B:
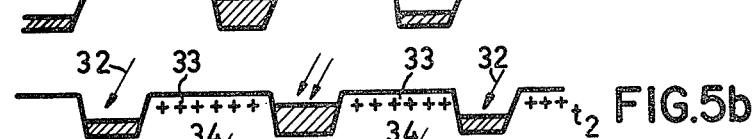
Figure 5C:
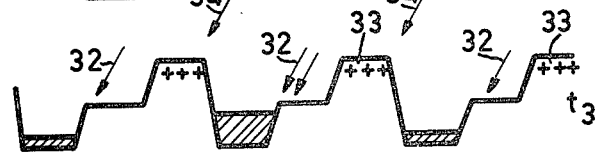

FIGS. 5a, 5b and 5c show a part of the potential profile which is formed in the CCD channels as a result of the voltages which during the integration period of the electrodes in the image section A are applied at three different instants. Since $+1$ V is applied to the electrodes 25, potential wells are formed below said electrodes in which the generated charge packets are stored. At $t_1$ a voltage of $-4$ V is applied to the electrodes 23 which are connected to the clock line $\phi_3$ and a voltage of $+6$ V is applied to the electrodes 24 ($\phi_2$). In the CCD channel the potential profile as shown in FIG. 5a is formed with a potential well below the integration gate 25, an overflow barrier below the clock electrodes 23 and a deeper well below the clock electrodes 24.

The values of the applied voltages mentioned here are such that the minimum of the comparatively deep (empty) potential well below the electrodes 24 is also situated at a given distance from the surface. In the case of weak exposure (denoted by the radiation 32) so few charge carriers are generated that the charge packets can be stored entirely in the potential well below the electrodes 24 at a distance from the surface. No charge is lost.

In the case of overexposure, however, the charge packet becomes so large that, when it is collected below electrode 24, it ensures accumulation at the surface below the electrode 24. However, the charge packet is not yet so large that charges can flow over the barrier below the electrode 23 and can thus fill adjacent potential wells.

FIG. 5d shows the potential profile at $t_1$ below the electrode 24 in a direction transverse to the surface. Curve A represents the potential with weak incident radiation. In this case the electrons 50 are stored at a finite distance from the interface between the oxide layer 22 and the n-type channel 16. Curve B shows the potential profile in the case of overexposure. Accumulation of electrons and drain of charge by means of recombination can now take place at the interface. Overflow (blooming) can be prevented according to the invention by capturing charge carriers by deep surface states. By subsequently applying a voltage $-4$ V at the electrode 24 (FIG. 5b) an inversion layer shown diagrammatically by the crosses 33 representing the holes is formed below the electrodes 24. As a result of this inversion layer 33, the surface states which had captured an electron can now capture holes (for the recombination of captured electrons). At $t_3$ a voltage of $+6$ V is again applied to the electrodes 24 so that accumulation can occur again below these electrodes and the surface states which had captured a hole can now capture an electron.

In this manner, excess charge carriers formed as a result of local overexposure can be drained by means of recombination by bringing the surface regions below the electrodes 24, beside the integration electrodes 25, alternately into inversion and into accumulation. In principle, only one electrode will suffice, for example the electrode 24, which is alternately switched into the accumulation state and into the inversion state, while the electrode 23 is kept at a fixed potential. Advantageously, however, the electrode 23 can be switched in opposite phase with electrode 24 between, for example, $-4$ and $-6$ V, as shown diagrammatically in broken lines in FIG. 4a. In that case, the holes required for the inversion layers 33 need not each time be supplied by the p-type regions 18 and 20, but may alternately be moved there and back between the electrodes 23 and 24. As a result of this, problems which could be caused by the comparatively high resistance in the region 20 and which could reduce the frequency properties of the device can be prevented.

The extent of overexposure which can be tolerated depends, inter alia, on the concentration of surface states and on the frequency with which the surface regions below the electrodes 24 are switched into the accumulation state and into the inversion state. For displaying maximum white in a scene, approximately $10^{11}$ electrons/cm$^2$ can be stored in the integration wells. The density of surface states (which are useful for the purpose described here) in the present state of the art is approximately $10^{10}$/cm$^2$. eV.

Within the forbidden band spacing substantially only those deep states are useful which have a sufficiently long generation time $$\left( \alpha \left\{ N_c \exp - \frac{E_c - E_t}{kT} \right\} - 1 \right)$$

so that the captured charge carriers cannot be immediately transferred again to the conduction band or the valance band, as the case may be. For silicon this means that the states with energy levels 0.10–0.15 eV from the conduction band or the valance band are not effective or are less effective. The overall concentration of suitable levels therefore is approximately $10^{10}$/cm$^2$. This means that if per line time the surface is brought once from inversion to accumulation and vice versa, with a sensor with 300 lines, $300 \times 10^{10} = 30.10^{11}$ electrons can be drained. So for a usual sensor an overexposure by a factor of approximately 30 can be tolerated, which is very reasonable for many applications. A higher factor can be obtained in a simple manner by increasing the number of times which the anti-blooming electrodes 24 are switched during the integration period.

The electrodes 24 are preferably clocked in the line suppression time $T_B$ so as to prevent crosstalk to the output signal. This mode of operation may also be used advantageously in those cases in which the electrodes 23 are not clocked in opposite phase with the electrodes 24 but are set up at a fixed potential.

Another manner of increasing the drain of excess of generated carriers, which manner can be used advantageously, consists in increasing the concentration of surface states. The quality of the charge-coupled device need as a result not or at least hardly be influenced disadvantageously since the charge transport may take place at a depth in the semiconductor body where the surface states are no longer effective.

The concentration of surface states which, with techniques improving, will become lower and lower in the future, can be brought to a level which is desired for the purpose of the present invention in various manners. According to the first method, the semiconductor body may be subjected to an oxidation treatment at a suitably chosen temperature, for example, lower than 1100° C. and, for example, between 800° C. and 1100° C. The empiric relationship between the concentration $N_{ss}$ of the surface states and the oxidation temperature is shown in FIG. 6. From this figure it appears, in general, that the concentration of surface states decreases when the temperature rises so that a desired value of $N_{ss}$ can be obtained by means of a suitable oxidation temperature.

Another manner of obtaining deep levels is by doping with an impurity, either locally or over the whole surface of the charge-coupled device. A suitable impurity which may be used advantageously is, for example, S which gives a level at a depth of 0.25 eV from the valence band and can be provided by means of ion implantation in any desired concentration. Another suitable dopant is Pt (0.37 eV from conduction band). A further advantage of these impurities is that they do not introduce energy levels around the intrinsic level, so that their contribution to the leakage current of the target is small.

For the above-described anti-blooming method at least three electrodes per bit are required, one for the integration of the generated charge carriers, and at least one which is switched alternately between inversion and accumulation, and one which ensures the separation between the charge packets.

It will be demonstrated with reference to FIGS. 7 and 8 that for n-type blooming the integration electrode itself may also be used, so that only two electrodes per bit are necessary and the sensor could also be operated as a two phase CCD. For illustrating the operation of such a pick-up camera, we will start with a target similar to the one in the preceding embodiment. However, it is assumed that below each electrode a more heavily and a less heavily n doped region is present, as is usual in two phase constructions. During the integration period a clock voltage and not a constant voltage is applied to the integration electrodes 25 below which the generated photocurrents are integrated. A constant voltage is applied to the electrodes 24.

FIG. 8 shows the voltages $\phi_1$ and $\phi_2$. FIG. 7 shows the potential profiles formed in the semiconductor body. In the vertical direction the potential is plotted (downwards), and in the horizontal direction the distance to the surface of the semiconductor layer is plotted. In FIG. 7, from left to right there are successively an electrode (24 or 25), the oxide layer 22, the n-type channel 16, the p-type region 20, and the n-type substrate 21.

The electrodes 24 which serve to separate successive charge packets from each other are set up at a fixed negative potential with respect to the n channel 16 so that in the low-doped part of the channel below these electrodes the potential according to the profile 40 (FIG. 7) is obtained. The same voltage and a much more positive voltage are applied alternately to the electrode 25. At the same voltage the profile according to curve 40 is obtained below the electrode 25 in the low-doped part, and a profile according to curve 41 is obtained in the more heavily doped part. The flat portion in curve 41 denotes that a charge packet is present below the electrode 25. With both curves (40 and 41) the potential at the surface is equal to that in the layer 20 so that the surface of the layer 16 at the area is inverted and the surface states are filled with holes. When a positive voltage is applied to the electrodes 25, the potential profiles 42 and 43 are formed for the lower-doped and higher-doped portions, respectively, below these electrodes. Curve 43 denotes an overexposed state in which the formed signal packet is so large that the electrons reach the surface (accumulation). The positive voltage level is chosen to be so that accumulation occurs only when a packet of maximum size (maximum white) is present. This voltage level is preferably chosen to be not too high because if too high the potential minimum could coincide with the surface of the semiconductor body so that electrons would be lost even with small charge packets. A suitable value for this voltage level can be determined in each specific case in a simple manner by those skilled in the art.

In the same manner as in the preceding embodiment, clock voltages instead of constant voltages may be applied to the electrodes 24, as is shown in broken lines in FIG. 8. By clocking the electrodes 24 in opposite phase with the electrodes 25, holes will be stored below electrode 24 which accelerate the formation of the inversion layers below the electrodes 25 so that possible frequency problems as a result of the comparatively high-ohmic p-layer 20 (see, FIG. 2) can be avoided.

The invention is not restricted to the embodiments described. It will be obvious that many variations are still possible to those skilled in the art without departing from the scope of this invention.

For example, instead of charge transport devices with bulk transport, charge-coupled devices with surface transport may also be used. In this case the integrated photocurrents are formed by carriers which are minority charge carriers as compared with the conductivity type of the semiconductor body.

FIG. 9 is a section view of a part of the image section A of the semiconductor device. The (n-type) CCD channel is now induced in the surface-adjoining p-type region 20 by applying to the clock electrodes 23–25 voltages which are positive with respect to the potential of the layer 20. FIGS. 10a and 10b show the surface potentials in the device shown in FIG. 9.

An excess of generated charge carriers can be drained by bringing the electrodes 24, located next to the integration electrodes 25, into inversion (FIG. 10a), as a result of which the excess of electrons (in case of an n-channel device) can be captured by surface states. These excess captured charge carriers may then be recombined with holes by bringing the the clock voltage on electrodes 24 situated next to the integration electrodes into accumulation (FIG. 10b). Preferably a less positive voltage is applied to the juxtaposed electrodes 24 in the inversion state than to the integration electrodes 25, so that only a part of the charge packet is moved to the electrodes 24, for example the part above maximum white. One of the advantages of this preferred embodiment is that for small charge packets, no charge carriers are needlessly lost.

The invention may also be used advantageously in systems which are operated according to the interlace principle. The camera may advantageously be operated in a manner in which various electrodes are each time used to drain excessive charge. Preferably, however, the same electrodes are used herefor as will be described with reference to the following specific example.

Figure 11:
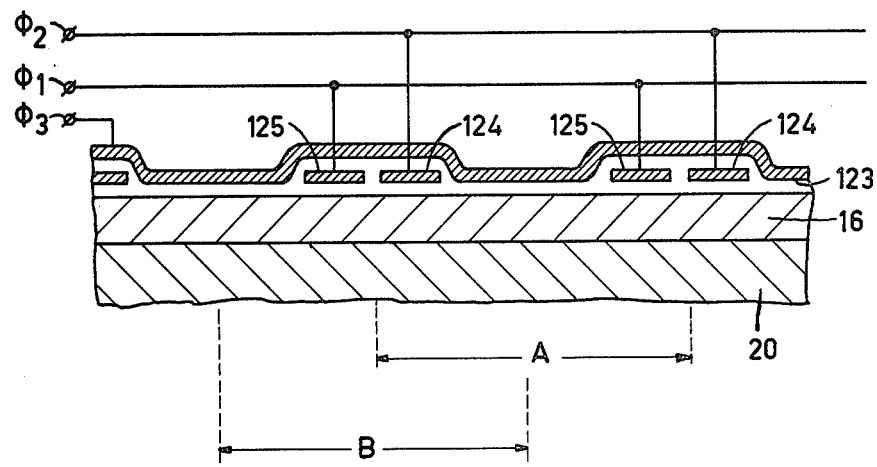
FIG. 11 shows a sectional view of another photosensitive target for use in a camera according to the invention.

FIG. 11 is a sectional view of a part of the image section of a sensor which corresponds, for the most part, to that described in the first embodiment. In the drawing, the p-type layer 20 and the n-type layer 16, in whch the channel is formed, are shown. Clock lines $\phi_1$, $\phi_2$ and $\phi_3$ are also shown. The clock electrodes are denoted in FIG. 11 by 123, 124 and 125. The electrode configuration differs from the device shown in FIGS. 1 to 3 insofar as the electrodes 123 extend as a long strip parallel to the charge transport direction of the CCD line over the semiconductor surface. The electrodes 124 and 125 extend in a direction transverse to the charge transport direction. This electrode configuration has the advantage that windows are obtained in the electrode structure. With these windows, the blue sensitivity can be increased, as is described in Netherlands patent application 8000999 and U.S. patent application Ser. No. 235,212, filed Feb. 17, 1981 (PHN 9683), the contents of which are deemed to be incorporated in this application by reference.

Figure 12A:
FIGS. 12a and 12b show the clock voltages to be applied in the embodiment of FIG. 11.
Figure 12B:
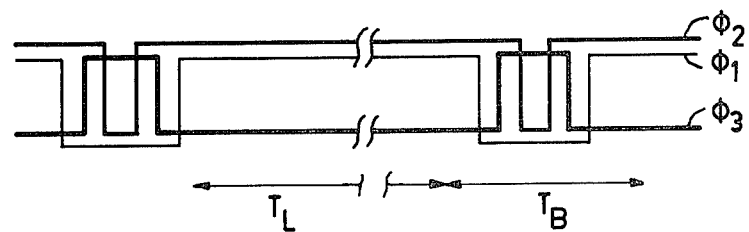

The clock voltages which are applied to the electrodes 123-125 during operation are shown in FIGS. 12a and 12b. During one frame period (FIG. 12a), the photocurrents are integrated below the electrode 123. A negative voltage is applied to the electrodes 125 to separate the picture elements from each other. A clock voltage is applied to the electrodes 124 to drain excessive charge by bringing the surface regions of the layer 16 below the electrodes 124 alternately into accumulation and into inversion, as described with reference to the first embodiment. This is shown diagrammatically in FIG. 12a by means of the positive voltage pulse $\phi_2$ which is applied to the clock electrodes 124 preferably during the line suppression period. Simultaneously, as already described above, clock $\phi_1$ can be pulsed in opposite phases so that holes originating from the surface region below the electrodes 124 can be stored temporarily below the electrodes 125. The region which at the clock voltages shown in FIG. 12a is occupied by a picture element (pixel) corresponds to the area A shown in FIG. 11.

During the next frame period clock voltages as shown in FIG. 12b are applied to the electrodes 123-125 so that a picture element corresponds to the region B shown in FIG. 11 which is shifted with respect to the region A. A negative voltage is applied to the clock electrode 123 which forms the separation between adjacent picture elements. The generated photocurrents are integrated below the electrodes 124 and 125 to which relatively positive voltages are applied.

The voltage levels $\phi_1$ and $\phi_2$ which in FIG. 12b are shown to be different for reasons of clarity may also be chosen to be equal during the time interval T. In order to drain excessive charge, first the voltage difference between $\phi_1$ and $\phi_3$ is inverted, preferably again during the line suppression time $T_B$, so that in analogy to the situation shown in FIG. 12a the electrodes 123 serve as a storage capacity and the electrodes 125 serve as a separation electrode between the pixels. The maximum white intensity is advantageously determined again by the charge storage capacity of the electrodes 123 and 124, while the electrodes 124 may also be used for draining the excessive charge. For this purpose, a negative voltage pulse can be applied to the electrodes 124 as is shown in FIG. 12b, during the interval $T_B$, so that inversion occurs below these electrodes and the excess electrons captured in accumulation can disappear by recombination.

The voltage difference between $\phi_1$ and $\phi_3$ can be inverted again and in the subsequent line time T charge can be integrated again below the electrodes 124, 125.

In the embodiments described the conductivity types may be reversed—of course while adapting the voltages to be used.

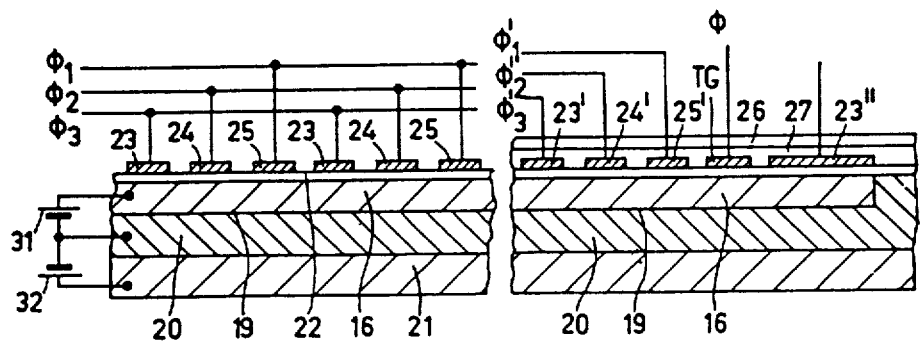

What is claimed is:

1. A solid state pickup camera comprising a photosensitive target comprising:
   a semiconductor body having a surface;
   an electrically insulating layer partially covering the surface of the semiconductor body;
   a plurality of first clock electrodes present on said electrically insulating layer, said first clock electrodes defining, in portions of the semiconductor body beneath the first clock electrodes, a plurality of charge storage capacities in which, during operation, charge carriers of a first type which are generated locally in the semiconductor body by absorption of incident radiation can be stored and integrated for an integration period;
   a plurality of second clock electrodes present on said electrically insulating layer, one second clock electrode being arranged adjacent to each first clock electrode;
   a plurality of third clock electrodes present on said electrically insulating layer, one third clock electrode being arranged adjacent to each first clock electrode;
   means for applying alternating voltages to the first clock electrodes so as to alternately bring surface regions of the semiconductor body beneath the first clock electrodes into an inversion state and into an accumulation state, in the accumulation state excess charge carriers of the first type being collected in traps in the surface regions, in the inversion state trapped excess charge carriers of the first type being recombined with charge carriers of a second type opposite to the first type;
   means for applying voltages to the second clock electrodes so as to bring surface regions of the semiconductor body beneath the second clock electrodes into an inversion state in which charge carriers of the second type are stored below the second clock electrodes when the surface regions beneath the first clock electrodes are in the accumulation state, said charge carriers of the second type being transferred to the surface regions beneath the first clock electrodes when the surface regions beneath the first clock electrodes are in the inversion state; and
   means for applying voltages to the third clock electrodes so that charge carriers of the first type are transferred to and stored in surface regions of the semiconductor body beneath the third clock electrodes when the surface regions beneath the first clock electrodes are in an inversion state, and so that charge carriers of the first type are transferred back to the surface regions beneath the first clock electrodes when the surface regions beneath the first clock electrodes are in an accumulation state.

2. A solid state pickup camera as claimed in claim 1, characterized in that:
the charge storage capacities are arranged in lines and columns which can be read out line-by-line; and
the surface regions beneath the first clock electrodes are brought from one state to the other state at least once per line read out.

3. A solid state pickup camera as claimed in claim 2, characterized in that the surface regions beneath the first clock electrodes are brought from one state to the other state during a line flyback time.

4. A solid state pickup camera as claimed in claim 3, characterized in that the photosensitive target further comprises:
a charge coupled device provided at the surface of the semiconductor body; and
a read out member;
the charge coupled device, in operation, transporting the stored charge carriers from the charge storage capacities to the read out member.

5. A solid state pickup camera as claimed in claim 4, characterized in that the first and second clock electrodes also form part of the charge coupled device.

6. A solid state pickup camera as claimed in claim 5, characterized in that the semiconductor body has an increased concentration of surface states with energy levels which are at least 0.15 eV from the two band edges and from the intrinsic level.

7. A solid state pickup camera as claimed in claim 6, characterized in that the increased concentration is due to impurities provided in the semiconductor body.

8. A solid state pickup camera as claimed in claim 7, characterized in that the impurities are sulfur atoms.

9. A solid state pickup camera as claimed in claim 8, characterized in that the semiconductor body comprises a substrate of one conductivity type having a surface layer of the same conductivity type, and having an intermediate layer of an opposite conductivity type adjacent to the surface layer.

10. A solid state pickup camera as claimed in claim 9, characterized in that:
the camera is operated in an interlace mode; and
during two successive frame p.

* * * * *

UNITED STATES PATENT AND TRADEMARK OFFICE
CERTIFICATE OF CORRECTION

PATENT NO.   :   4,485,315

DATED        :   November 27, 1984

INVENTOR(S)  :   Marnix G. Collet, et al.

It is certified that error appears in the above-identified patent and that said Letters Patent is hereby corrected as shown below:

The title page should be deleted to appear as per attached title page.

Signed and Sealed this

Twenty-third Day of July 1985

[SEAL]

Attest:

DONALD J. QUIGG

Attesting Officer

Acting Commissioner of Patents and Trademarks

United States Patent [19]

Collet et al.

[11] Patent Number: 4,485,315
[45] Date of Patent: Nov. 27, 1984

[54] BLOOMING SUPPRESSION IN A CCD IMAGING DEVICE

[75] Inventors: Marnix G. Collet, Sunnyvale, Calif.; Johannes G. van Santen, Eindhoven, Netherlands

[73] Assignee: U.S. Philips Corporation, New York, N.Y.

[21] Appl. No.: 578,301

[22] Filed: Feb. 9, 1984

Related U.S. Application Data

[63] Continuation of Ser. No. 231,649, Feb. 5, 1981, abandoned.

[30] Foreign Application Priority Data

Feb. 19, 1980 [NL] Netherlands ............... 8000998

[51] Int. Cl.³ ............... H01L 29/78; H01L 27/14; H01L 31/00; G11C 19/28
[52] U.S. Cl. .................. 307/311; 357/24; 357/30; 377/58
[58] Field of Search .......... 357/24 LR, 24 M, 30; 377/58; 307/311

[56] References Cited

U.S. PATENT DOCUMENTS 3,931,465 1/1976 Levine ............... 357/24 LR
4,328,432 5/1982 Yamazaki ............ 357/24 LR

OTHER PUBLICATIONS

Sequin, C. H., "Blooming Suppression in Charge-Coupled Area Imaging Devices", The Bell System Technical Journal, pp. 1923-1926, (Oct. 1972).
Kosonocky, W. F., et al., "Control of Blooming in Charge-Coupled Images", RCA Review, pp. 3-24, (Mar., 1974).

Primary Examiner—Gene M. Munson
Attorney, Agent, or Firm—Marc D. Schechter

[57] ABSTRACT

A CCD solid state image sensor device. During the integration period the surface in the image pick-up section is switched alternately into inversion and into accumulation. Any excess of charge carriers which results from possible overexposure can thus be drained by means of recombination via sufaces states.

10 Claims, 18 Drawing Figures